(12) United States Patent
Hoshino et al.

(10) Patent No.: US 8,816,310 B2
(45) Date of Patent: Aug. 26, 2014

(54) SEMICONDUCTOR RELAY

(75) Inventors: Narutoshi Hoshino, Osaka (JP);
Yoshihiro Fujiwara, Osaka (JP);
Takashi Shibano, Osaka (JP); Shinsuke Taka, Osaka (JP)

(73) Assignee: Panasonic Corporation, Osaka (JP)

( * ) Notice: Subject to any disclaimer, the term of this patent is extended or adjusted under 35 U.S.C. 154(b) by 246 days.

(21) Appl. No.: 13/500,710

(22) PCT Filed: Oct. 7, 2010

(86) PCT No.: PCT/IB2010/002533
§ 371 (c)(1),
(2), (4) Date: Apr. 6, 2012

(87) PCT Pub. No.: WO2011/042796
PCT Pub. Date: Apr. 14, 2011

(65) Prior Publication Data
US 2012/0199851 A1  Aug. 9, 2012

(30) Foreign Application Priority Data

Oct. 9, 2009  (JP) .................. 2009-235379
Feb. 15, 2010  (JP) .................. 2010-030387

(51) Int. Cl.
| H01L 31/16 | (2006.01) |
| H01L 31/153 | (2006.01) |
| H03K 17/687 | (2006.01) |
| H03K 17/785 | (2006.01) |
| H01L 31/147 | (2006.01) |
| H03K 17/689 | (2006.01) |

(52) U.S. Cl.
CPC .......... *H01L 31/153* (2013.01); *H03K 17/6871* (2013.01); *H01L 2924/13091* (2013.01); *H01L 2224/48137* (2013.01); *H03K 17/785* (2013.01); *H01L 31/147* (2013.01); *H01L 2224/48247* (2013.01); *H03K 17/689* (2013.01); *H01L 2224/48465* (2013.01); *H01L 2224/48257* (2013.01)
USPC .............................. 250/551; 250/239; 257/81

(58) Field of Classification Search
CPC ..... H01H 50/02; H01H 50/021; H01H 50/04; H01H 50/041; H01H 50/047; H03K 17/78
USPC ............ 250/551, 239, 214 R; 257/80, 81, 82; 385/92, 94
See application file for complete search history.

(56) References Cited

U.S. PATENT DOCUMENTS

| 7,235,803 B2 * | 6/2007 | Matsuyama .................. 250/551 |
| 8,410,464 B2 * | 4/2013 | Omura .......................... 250/551 |
| 2007/0187629 A1 * | 8/2007 | Matsuyama .................. 250/551 |

FOREIGN PATENT DOCUMENTS

| JP | H11-054787 | 2/1999 |
| JP | 2002-050950 A | 2/2002 |

(Continued)

OTHER PUBLICATIONS

The International Search Report for PCT/IB2010/002533, Dec. 14, 2010.

(Continued)

*Primary Examiner* — Kevin Pyo
(74) *Attorney, Agent, or Firm* — Bacon & Thomas, PLLC

(57) ABSTRACT

A semiconductor relay includes two MOSFETs; a light emitting element; a light-receiving drive element for switching on and off the two MOSFETs; two output and two input conductor plates electrically connected to the two MOSFETs and the light emitting element, respectively; and an encapsulating resin encapsulating the two MOSFETs, the light emitting element, the light-receiving drive element, the two output and the two input conductor plates. The two output and two input conductor plates includes terminal portions which protrude outside the encapsulating resin and are mounted on a common printed circuit board. Further, the two output conductor plates includes mount portions on which the two MOSFETs are mounted or on which drain electrodes of the two MOSFETs are connected, and the mount portions are encapsulated by the encapsulating resin in such an orientation that a thickness direction of the mount portions intersects that of the printed circuit board.

6 Claims, 13 Drawing Sheets

(56) References Cited

FOREIGN PATENT DOCUMENTS

| | | |
|---|---|---|
| JP | 2003008050 | 1/2003 |
| JP | 2007165621 | 6/2007 |

OTHER PUBLICATIONS

Office Action dated Apr. 30, 2013 issued in corresponding Japanese application No. 2009-235379 (w/English summary).

* cited by examiner

SEMICONDUCTOR RELAY

FIELD OF THE INVENTION

The present invention relates to a semiconductor relay.

BACKGROUND OF THE INVENTION

Conventionally, there is provided a semiconductor relay often called a MOSFET output photocoupler or an optical MOSFET (see, e.g., Patent document 1).

FIGS. 11 to 14 illustrate an example of a semiconductor relay 1. The semiconductor relay 1 includes two input terminal portions 51 and two output terminal portions 61. The semiconductor relay 1 further includes a light emitting element 2 connected between the input terminal portions 51, two MOSFETs 3a and 3b serially connected to each other in between the output terminal portions 61 and a light-receiving drive element 4 for switching the MOSFETs 3a and 3b on and off depending on the presence and absence of the light emitted by the light emitting element 2.

The light emitting element 2 has a pair of terminals electrically connected to the input terminal portions 51, one to each input terminal portion. The light emitting element 2 emits light as a specified electric power (e.g., a DC power having a specified voltage) is applied between the terminals. As the light emitting element 2, it is possible to use, e.g., a light emitting diode.

The light-receiving drive element 4 includes a light receiving element 4a configured to receive the light from the light emitting element 2 to generate an electric power and formed of, e.g., an array of photodiodes, and a drive circuit 4b configured to switch on the MOSFETs 3a and 3b with the electric power supplied from the light receiving element 4a during the time period when the light receiving element 4a generates the electric power and to switch off the MOSFETs 3a and 3b during the time period when the light receiving element 4a does not generate the electric power. The light receiving element 4a and the drive circuit 4b are integrated into a single chip. The light-receiving drive element 4 is well-known in the art and therefore will not be described in detail.

Each of the MOSFETs 3a and 3b is of an N-channel type. The source electrodes 31 of the respective MOSFETs 3a and 3b are electrically connected to each other. The gate electrodes 32 and the source electrodes 31 of the respective MOSFETs 3a and 3b are electrically connected to the drive circuit 4b of the light-receiving drive element 4. The drain electrodes 33 of the respective MOSFETs 3a and 3b are electrically connected to the output terminal portions 61, one to each output terminal portion. In other words, the parasitic diodes of the respective MOSFETs 3a and 3b are reversely arranged with respect to each other. Thus, the electric connection (conduction) between the output terminal portions 61 connected to the respective ends of the serial circuits of the two MOSFETs 3a and 3b are switched on and off depending on the on/off condition of the MOSFETs 3a and 3b regardless of the direction of the voltage applied to between the output terminal portions 61.

The operation of the semiconductor relay 1 will now be described. During the time period when a specified electric power is not inputted to between the input terminal portions with the light emitting element 2 turned off, the respective MOSFETs 3a and 3b are kept switched off. Thus, the electric connection between the output terminal portions 61 is switched off.

If a specified electric power is inputted to between the input terminal portions 51 and if the light emitting element 2 is turned on, the light-receiving drive element 4 switches on the MOSFETs 3a and 3b, whereby the electric connection between the output terminal portions 61 is switched on.

If the light emitting element 2 is turned off, the light-receiving drive element 4 switches off the MOSFETs 3a and 3b, whereby the electric connection between the output terminal portions 61 is switched off again.

In this regard, the semiconductor relay 1 includes an encapsulating resin 10 for encapsulating the light emitting element 2, the MOSFETs 3a and 3b and the light-receiving drive element 4. At least the portion of the encapsulating resin 10 interposed between the light emitting element 2 and the light receiving element 4a of the light-receiving drive element 4 is formed of a synthetic resin capable of transmitting the light emitted from the light emitting element 2.

The semiconductor relay 1 further includes, in the encapsulating resin 10, two input conductor plates 5 made of an electrically conductive material and having connection portions 52 electrically connected to the respective terminals of the light emitting element 2. One terminal of the light emitting element 2 is surface mounted on the connection portion 52 of one of the input conductor plates 5. The other terminal of the light emitting element 2 is electrically connected to the connection portion 52 of the other input conductor plate 5 by wire bonding. The respective input conductor plates 5 have input terminal portions 51 protruding outside the encapsulating resin 10. The respective input conductor plates 5 can be formed by, e.g., subjecting a metal plate to punching and bending.

The semiconductor relay 1 further includes, in the encapsulating resin (package) 10, two output conductor plates 6 made of an electrically conductive material and having mount portions 62 on which the drain electrodes 33 of the MOSFETs 3a and 3b are respectively surface mounted and a central conductor plate 7 made of an electrically conductive material into a flat shape. The light-receiving drive element 4 is surface mounted on the central conductor plate 7 while the central conductor plate 7 is encapsulated with the encapsulating resin 10. Similar to the input conductor plates 5, the output conductor plates 6 and the central conductor plate 7 can be formed by subjecting a metal plate to punching and bending.

The source electrodes 31 of the respective MOSFETs 3a and 3b are electrically connected to each other by wire bonding. The gate electrodes 32 are electrically connected to the light-receiving drive element 4 by wire bonding. Further, the source electrode 31 of the MOSFET 3a and the light-receiving drive element 4 are electrically connected to the central conductor plate 7 by wire bonding. Thus, the source electrodes 31 of the respective MOSFETs 3a and 3b are electrically connected to the light-receiving drive element through the central conductor plate 7. Further, the respective output conductor plates 6 have output terminal portions 61 protruding outside the encapsulating resin 10.

As shown in FIGS. 13 and 14, the input terminal portions 51 and the output terminal portions 61 are respectively surface mounted on the electrically conductive patterns P1 and P2 formed on the mount surface (the upper surface in FIG. 14) of a common printed circuit board P.

In the conventional case, the thickness direction of the respective mount portions 62 and the central conductor plate 7 coincides with the thickness direction of the printed circuit board P.

Patent document 1: Japanese Patent Application Publication No. 2003-8050

In the above case, when a high-frequency signal is transmitted between the output terminal portions 61, the central conductor plate 7 connected to the source electrodes 31 of the respective MOSFETs 3a and 3b functions as a so-called stub circuit. Thus, the high-frequency signal flows into the central conductor plate 7.

Further, in the printed circuit board P, it is sometimes the case that a conductive ground pattern P3 having the same electric potential as the ground is formed on the entirety of the non-mount surface (the lower surface in FIG. 14) in order to shield, e.g., an electromagnetic noise. In this case, a parasitic capacitance Cp is generated between the mount portions 62 of the respective output conductor plates 6 and the ground pattern P3 opposite to each other and between the central conductor plate 7 and the ground pattern P3 opposite to each other. If such is the case, the high-frequency signal flows out from the mount portions 62 of the respective output conductor plates 6 or the central conductor plate 7 through the parasitic capacitance Cp. This leads to an increase in insertion loss.

SUMMARY OF THE INVENTION

In view of the above, the present invention provides a semiconductor relay capable of reducing an insertion loss.

In accordance with an embodiment of the present invention, there is provided a semiconductor relay, including: two MOSFETs serially connected to each other, the MOSFETs having parasitic diodes reversely arranged with respect to each other; a light emitting element having a pair of terminals, the light emitting element being configured to emit light as a specified electric power is applied between the terminals; a light-receiving drive element configured to switch on and off the two MOSFETs depending on the presence and absence of the light emitted by the light emitting element; two output conductor plates made of an electrically conductive material, each of the output conductor plates being electrically connected to one end of each of serial circuits of the two MOSFETs; two input conductor plates made of an electrically conductive material, each of the input conductor plates being electrically connected to the respective terminals of the light emitting element; and an encapsulating resin configured to encapsulate the two MOSFETs, the light emitting element, the light-receiving drive element, the two output conductor plates and the two input conductor plates.

The two output conductor plates and the two input conductor plates includes terminal portions protruding outside the encapsulating resin, the terminal portions being mounted on a common printed circuit board, and the two output conductor plates includes mount portions on which the two MOSFETs are respectively mounted or on which drain electrodes of the two MOSFETs are respectively connected, the mount portions being encapsulated by the encapsulating resin in such an orientation that a thickness direction of the mount portions intersects a thickness direction of the printed circuit board.

Further, the two MOSFETs may be integrated into a single chip.

Further, each of the two MOSFETs may be surface mounted on each of the output conductor plates.

Further, the two MOSFETs may be interconnected at an interconnecting point, and the interconnecting point may be directly electrically connected to the light-receiving drive element by a wire bonding.

The semiconductor relay described above may further include a flat-shaped central conductor plate made of an electrically conductive material to which the light-receiving drive element is fixed. Further, the central conductor plate may be encapsulated by the encapsulating resin in such an orientation that a thickness direction of the central conductor plate intersects the thickness direction of the printed circuit board. Further, the two MOSFETs may be interconnected at an interconnecting point, and the interconnecting point and the light-receiving drive element may be electrically connected to the central conductor plate by wire bonding.

In accordance with the present invention, the respective mount portions are encapsulated by the encapsulating resin in such an orientation that the thickness direction of the mount portions intersects the thickness direction of the printed circuit board mounting thereon the respective terminal portions. Therefore, as compared with a case where the thickness direction of the respective mount portions is parallel to the thickness direction of the printed circuit board, it is possible to reduce the parasitic capacitance possibly generated between the conductive patterns of the printed circuit board and the respective mount portions. This makes it possible to reduce the insertion loss.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
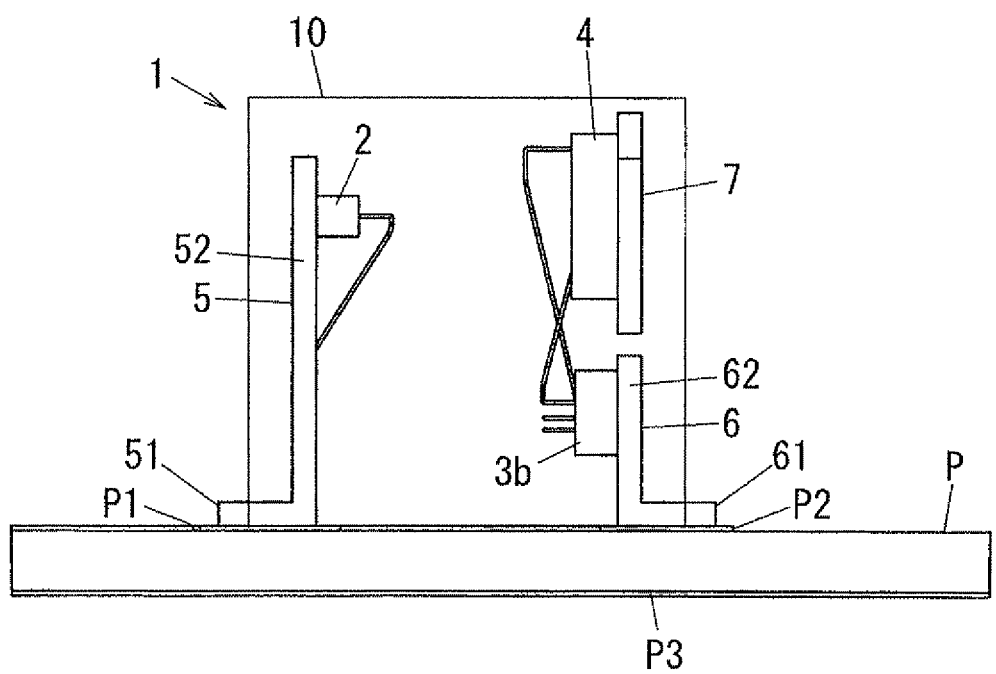
FIG. 1 is a front view showing a semiconductor relay in accordance with a first embodiment of the present invention.

Hereinafter, embodiments of the present invention will be described with reference to the accompanying drawings which form a part hereof. Throughout the drawings, like reference numerals will be given to like parts, and redundant description thereof will be omitted.

The basic configurations of the embodiments are similar to those of the conventional semiconductor relay shown in FIGS. 11 to 14. Therefore, redundant description thereof will be omitted.

First Embodiment

Figure 2A:
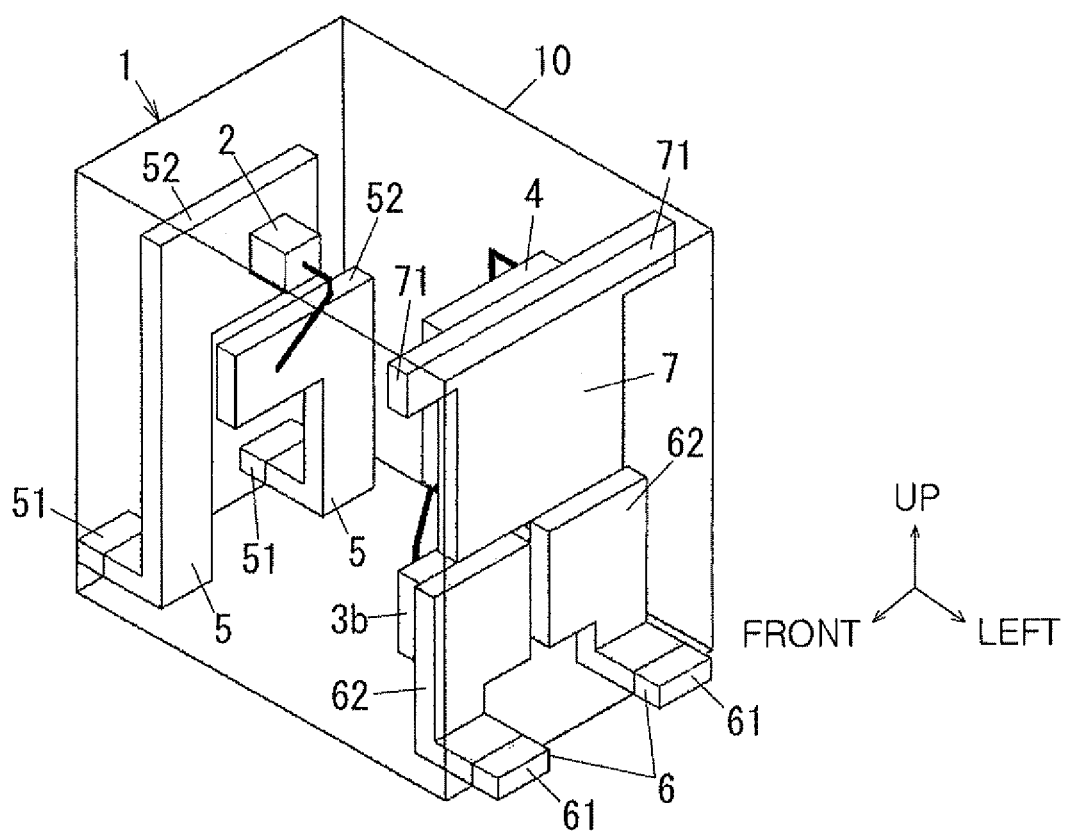
FIGS. 2A and 2B are perspective views of the semiconductor relay in accordance with the first embodiment as seen from different viewpoints.
Figure 2B:
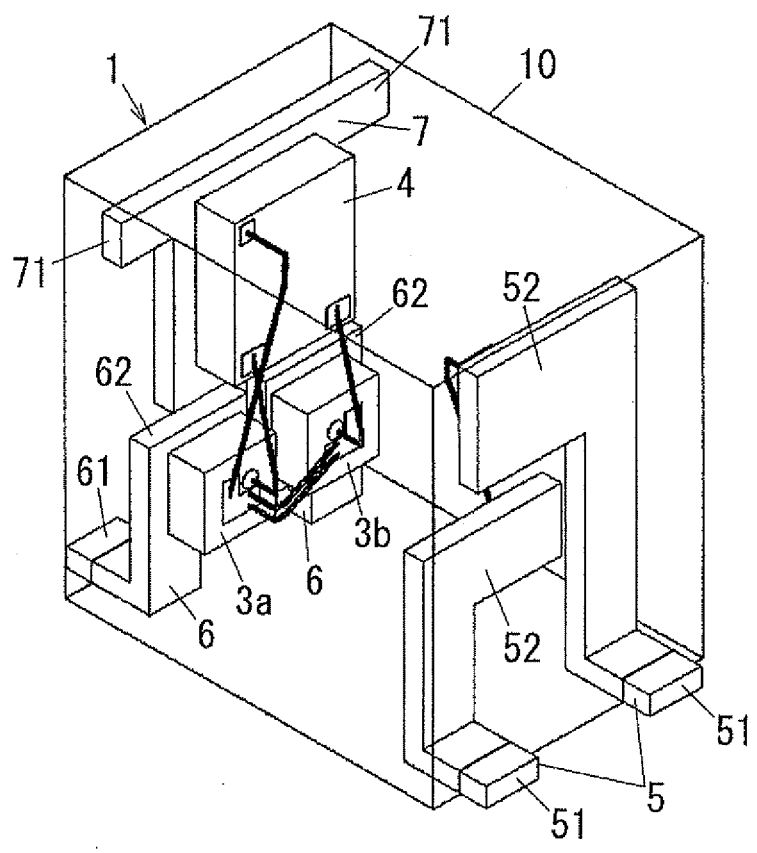

In a first embodiment of the present invention, as shown in FIGS. 1 and 2, central conductor plate 7 and respective mount portions 62 are oriented such that the thickness direction thereof intersects (at a right angle, in the present embodiment) the thickness direction of a printed circuit board P on which respective terminal portions 51 and 61 are surface mounted.

More specifically, each of input conductor plates 5 and each of output conductor plates 6 are once bent at a right angle in the thickness direction to have a L-like shape. The input terminal portion 51 or the output terminal portion 61 is formed at one side of the bent portion while a connecting portion 52 or the mount portion 62 is formed at the other side of the bent portion.

Figure 3:
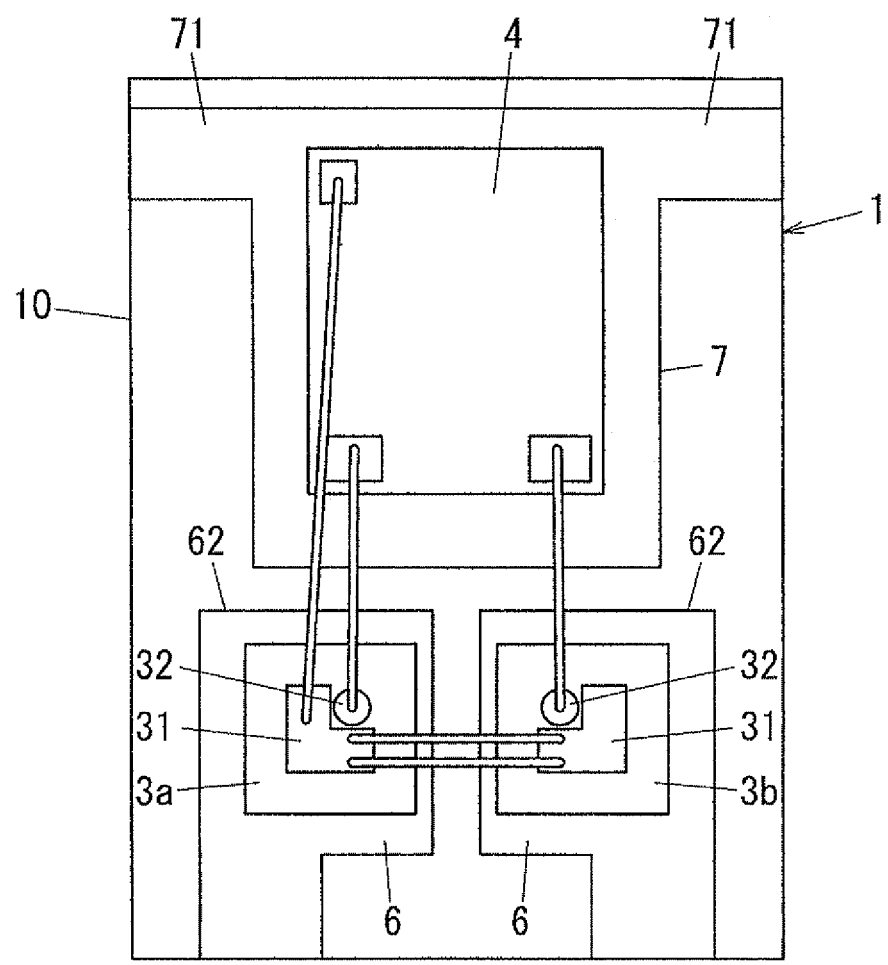
FIG. 3 is a left side view showing main portions of the semiconductor relay in accordance with the first embodiment.

Further, a source electrode 31 of a MOSFET 3a is directly electrically connected to a light-receiving drive element 4 by wire bonding as shown in FIG. 3 and not by way of a central conductor plate 7 as in the conventional case. Thus, the number of required wire bonding is reduced as compared with the conventional case where the source electrode 31 of the MOSFET 3a is connected to the light-receiving drive element 4 through the central conductor plate 7.

Drain electrodes 33 (see FIG. 11) of the MOSFET 3a and a MOSFET 3b are respectively surface mounted on the mount portions 62 of the output conductor plates 6. Therefore, as compared with a case where the electric connection of the drain electrodes 33 of the respective MOSFETs 3a and 3b to the mount portions 62 is performed by wire bonding, it becomes possible to increase the current capacity. Tests conducted by the present inventors reveal that the current capacity can be increased twice or more.

An encapsulating resin 10 has a rectangular parallelepiped shape as a whole. A semiconductor relay 1 is surface mounted on the printed circuit board P with one surface (the lower surface in FIG. 1) of the encapsulating resin 10 facing the printed circuit board P.

In the following description, the upper, lower, left and right directions will be defined on the basis of FIG. 1. The frontward direction orthogonal to the sheet surface in FIG. 1 (the left lower direction indicated by an arrow in FIG. 2A) will be referred to as front direction. These directions are defined merely for the convenience in description and may not necessarily coincide with the directions in an actual use state.

The central conductor plate 7 has a flat shape with the thickness direction thereof extending in the left-right direction. The central conductor plate 7 includes arm portions 71 protruding from the upper end portion toward the front and rear sides. When the semiconductor relay 1 is encapsulated with the encapsulating resin 10 in the manufacturing process, the central conductor plate 7 and the light-receiving drive element 4 are supported by the arm portions 71.

One of the opposite surfaces in the thickness direction of each of the input terminal portions 51 or each of the output terminal portions 61, from which the connecting portion 52 or the mount portion 62 does not protrude, is substantially flush with the lower surface of the encapsulating resin 10. The respective input terminal portions 51 are arranged side by side along the front-rear direction and protrude leftward from the lower end portion of the left surface of the encapsulating resin 10. The respective output terminal portions 61 are arranged side by side along the front-rear direction and protrude rightward from the lower end portion of the right surface of the encapsulating resin 10.

The central conductor plate 7 and the respective mount portion 62 are encapsulated in such an orientation that the inner and outer surfaces thereof extend parallel to the left and right surfaces of the encapsulating resin 10 orthogonal to the lower surface of the encapsulating resin 10. In other words, the thickness direction of the central conductor plate 7 and the respective mount portion 62 is orthogonal to the thickness direction of the printed circuit board P.

Figure 4:
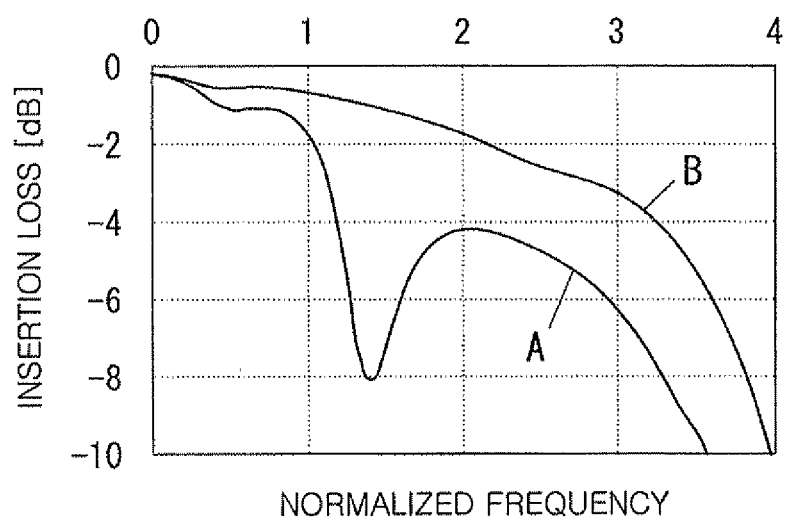
FIG. 4 shows the frequency characteristics of the semiconductor relay in accordance with the first embodiment (curve B) and a conventional semiconductor relay (curve A)
Figure 12:
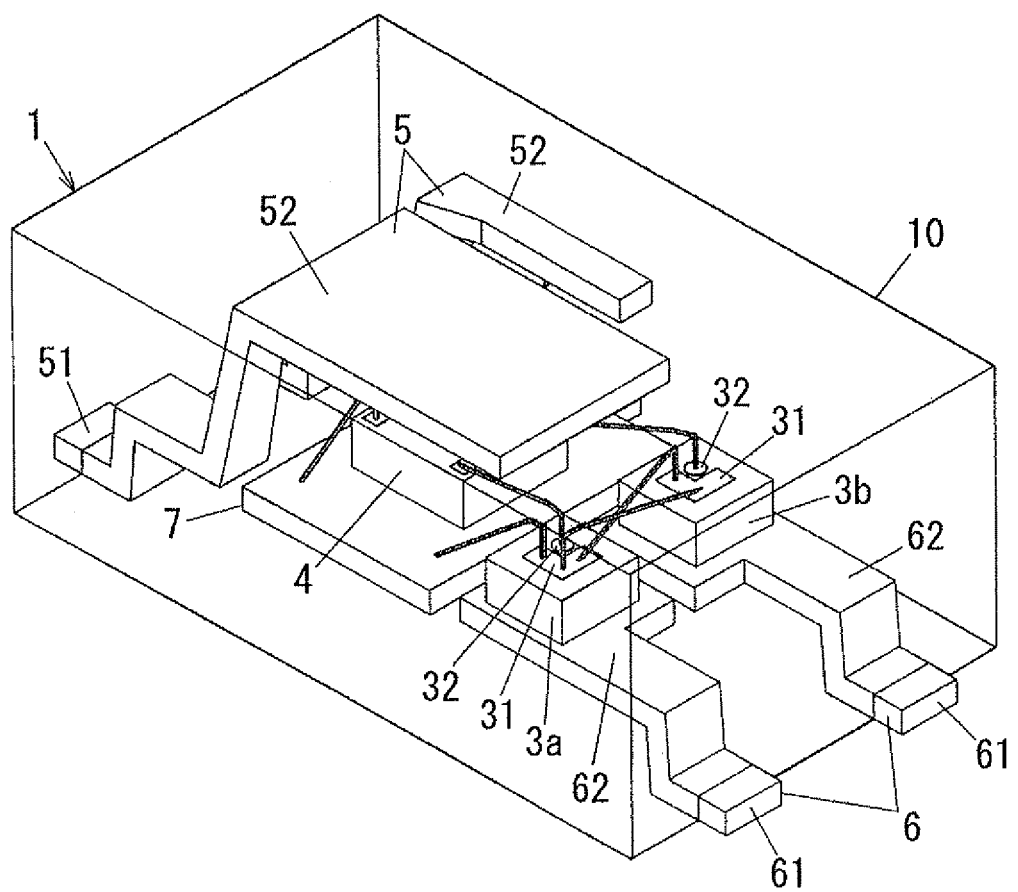
FIG. 12 is a perspective view showing the conventional semiconductor relay.
Figure 13:
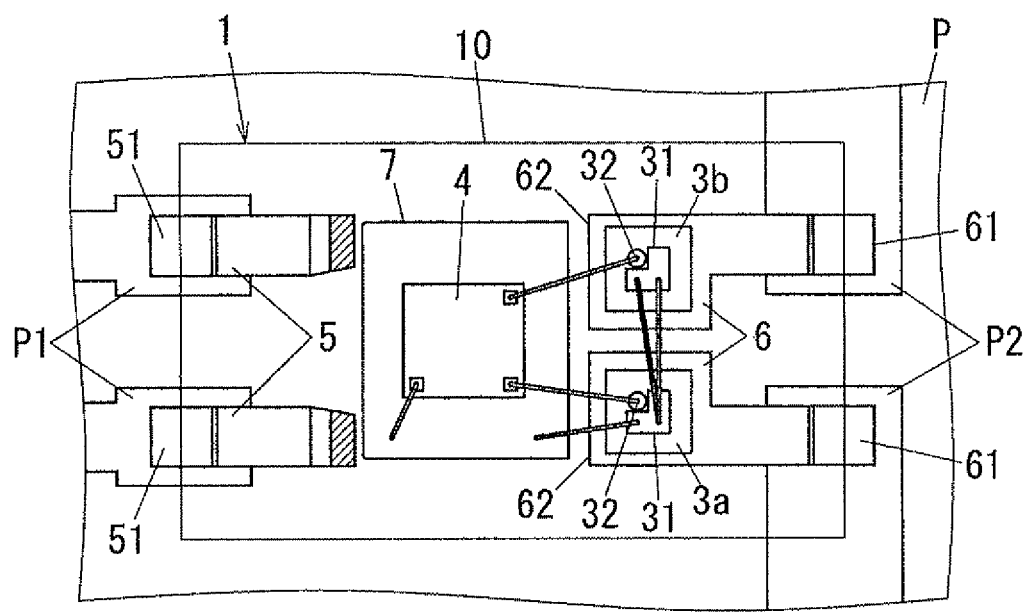
FIG. 13 is a partially cut-away plan view showing the conventional semiconductor relay.
Figure 14:
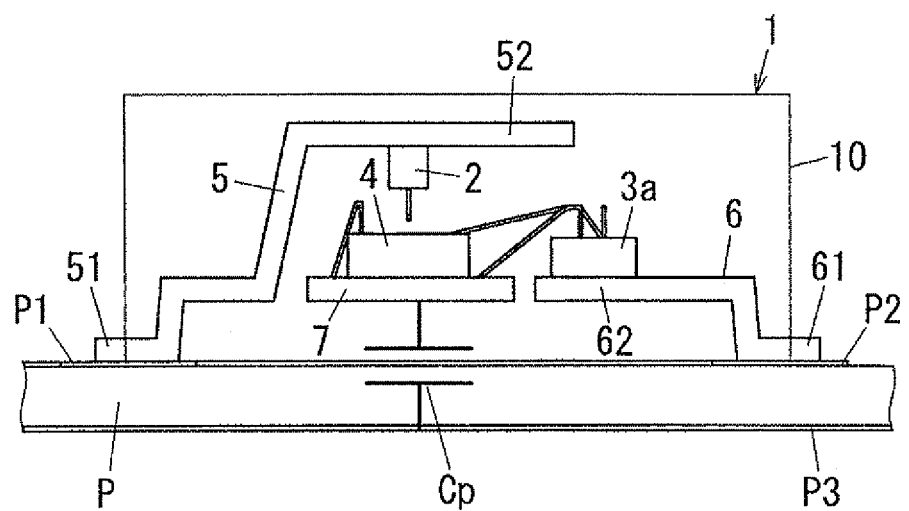
FIG. 14 is a front view showing the conventional semiconductor relay.

In this configuration, as compared with a case where the thickness direction of the respective mount portions 62 is parallel to the thickness direction of the printed circuit board P mounting thereon the respective terminal portions 51 and 61, it is possible to reduce the parasitic capacitance possibly generated between a conductive pattern P3 of the printed circuit board P and the respective mount portions 62. This makes it possible to reduce an insertion loss. Referring to FIG. 4, the analysis result of the insertion loss in conventional case described in respect of FIGS. 12 to 14 is indicated by a curve A and the analysis result of the insertion loss in the present embodiment is indicated by a curve B. As can be seen in FIG. 4, the insertion loss is smaller in the present embodiment than in the conventional case.

Figure 5:
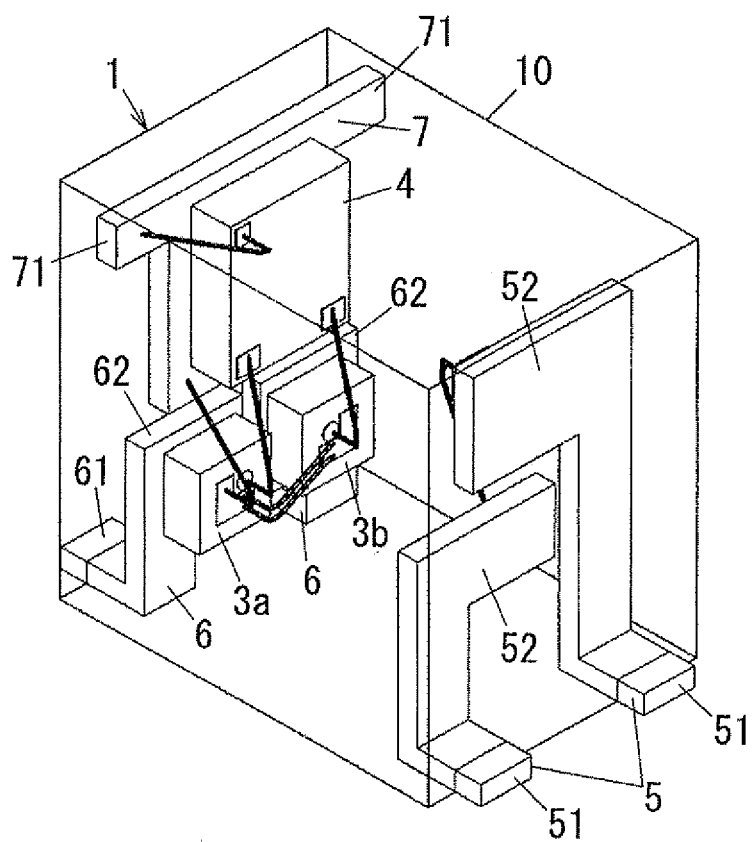
FIG. 5 is a perspective view showing a modification of the semiconductor relay in accordance with the first embodiment.
Figure 6:
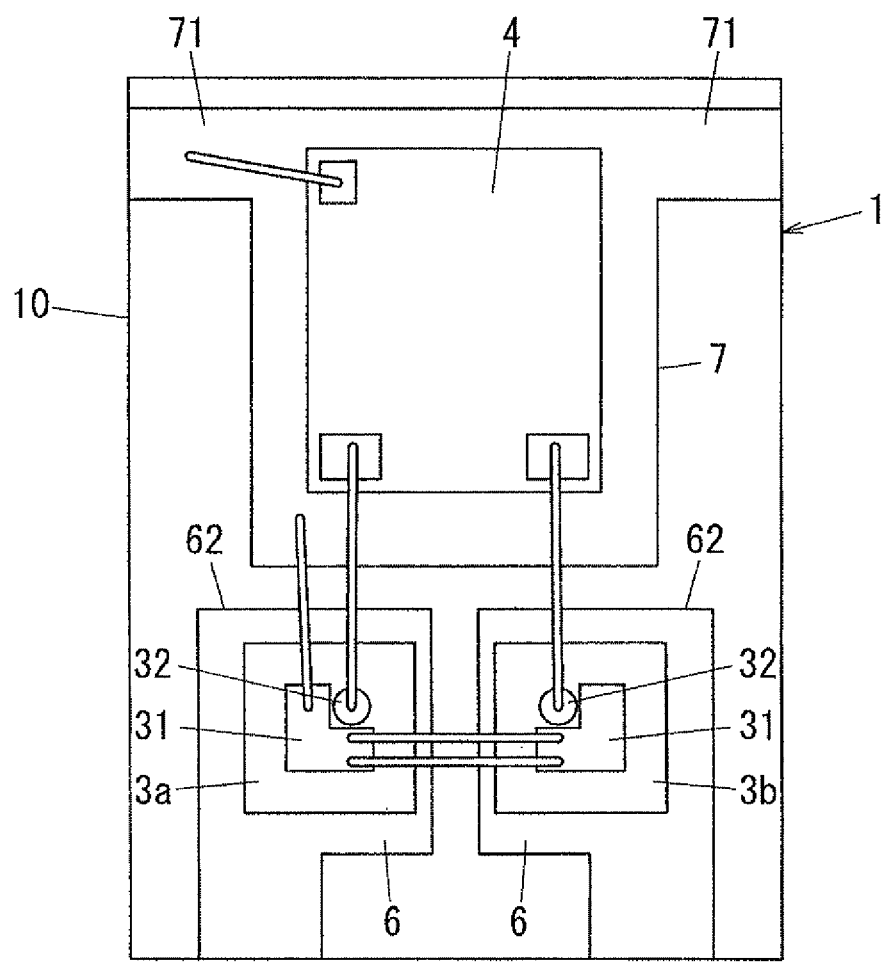
FIG. 6 is a left side view showing main portions of the modification shown in FIG. 5.

As shown in FIGS. 5 and 6, the source electrode 31 of the MOSFET 3a may be electrically connected to the light-receiving drive element 4 through the central conductor plate 7 as in the conventional case. In other words, the source electrode 31 of the MOSFET 3a (the interconnecting point of the two MOSFETs 3a and 3b) and the light-receiving drive element 4 are electrically connected to the central conductor plate 7 by wire bonding. In this case, the high-frequency signal transmitted between the output terminal portions 61 flows into the central conductor plate 7 because the source electrodes 31 of the respective MOSFETs 3a and 3b are mounted on the central conductor plate 7 by wire bonding.

However, since the thickness direction of the central conductor plate 7 is orthogonal to the thickness direction of the printed circuit board P, it is possible to suppress an increase in insertion loss regardless of the inflow of the high-frequency signal. When such configuration is employed, the number of wire bonding required in a manufacturing process grows larger than that in the example shown in FIGS. 1 to 3. It is however possible to increase the drop speed of the voltage applied between the gate electrodes and the source electrodes of the respective MOSFETs 3a and 3b. This makes it possible to shorten the turn-off time of the semiconductor relay 1. Tests conducted by the present inventors reveal that the turn-off time in the example shown in FIGS. 5 and 6 can be reduced to one half or less of the turn-off time in the example shown in FIGS. 1 to 3.

Figure 7:
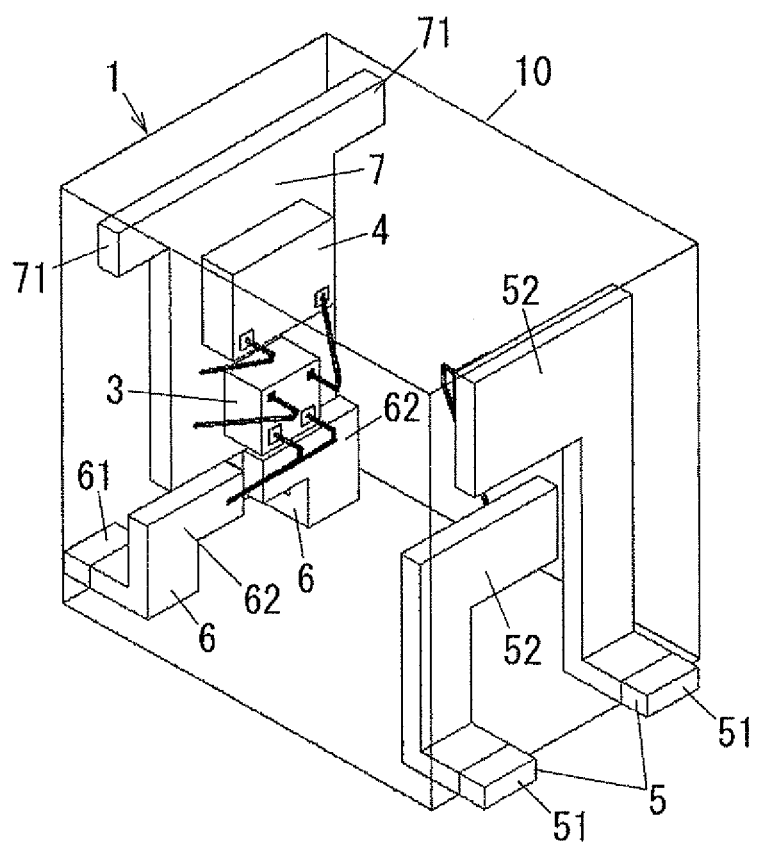
FIG. 7 is a perspective view showing another modification of the semiconductor relay in accordance with the first embodiment.
Figure 8:
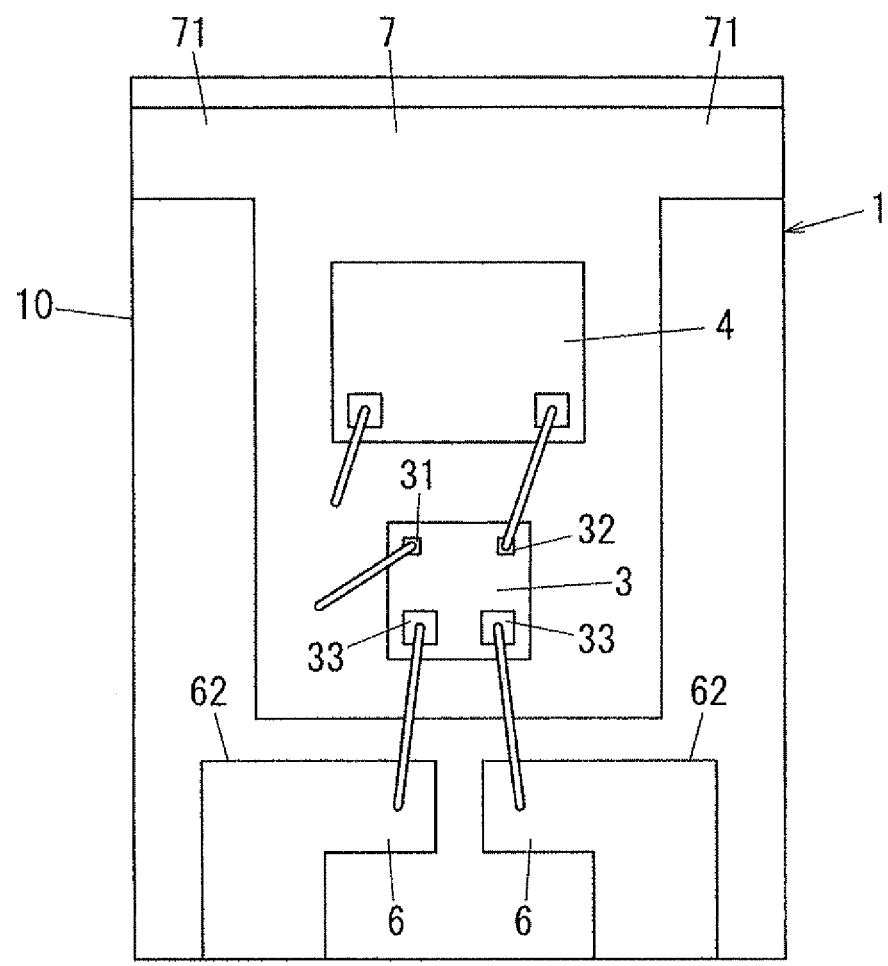
FIG. 8 is a left side view showing main portions of the modification shown in FIG. 7.

As shown in FIGS. 7 and 8, it may be possible to use a switching element 3 in which two MOSFETs 3a and 3b are integrated into a single chip. The switching element 3 can be realized through the use of a well-known art and, therefore, the detail description and drawings of the switching element 3 will be omitted. In the example shown in FIGS. 7 and 8, the switching element 3 is fixed to the surface of the central conductor plate 7 to which the light-receiving drive element 4 is fixed. In each of the MOSFETs 3a and 3b of the switching element 3, the source electrode (i.e., the interconnecting point of the two MOSFETs 3a and 3b) is connected to the central conductor plate 7 by wire bonding. The gate electrode 32 is directly electrically connected to the light-receiving drive element 4 by wire bonding. The drain electrode 33 is connected to the mount portion 62 of each of the output conductor plates 6 by wire bonding. If suitable integration is performed in the above manner, it becomes possible to reduce the number of parts.

In place of the configuration in which one surface in the thickness direction of each of the terminal portions 51 and 61 is surface mounted on the printed circuit board P, it may be possible to employ a configuration in which the lower end surface of each of the terminal portions 51 and 61 is surface mounted on the printed circuit board P with the thickness direction of the terminal portions 51 and 61 extending in the left-and-right direction. In this case, each of the input conductor plates 5 and the output conductor plates 6 may be formed into a flat shape with no bent portion.

Second Embodiment

A second embodiment of the present invention will now be described with reference to FIGS. 9 and 10. The basic configurations of the present embodiment are similar to those of the first embodiment. Like reference numeral will be given to like parts, and redundant description thereof will be omitted.

In a semiconductor relay 1 of the present embodiment, similar to the first embodiment, a mount surface of a central conductor plate 7 mounting thereon a light-receiving drive element 4, mount surfaces (mount portions 62) of output conductor plates 6 mounting thereon MOSFETs 3a and 3b and mount surfaces of input conductor plates 5 mounting thereon a light emitting element 2 are perpendicular to a lower end surface 10a of an encapsulating resin (package) 10.

Figure 9:
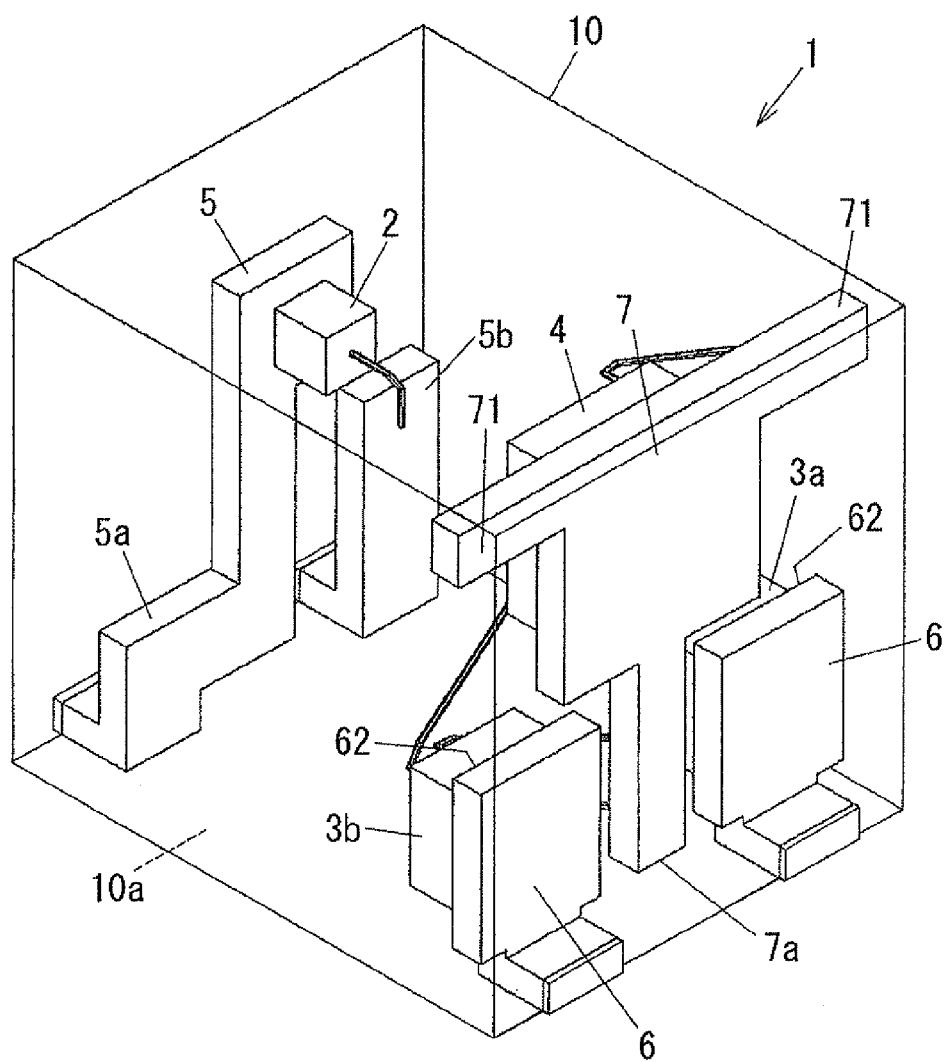
FIG. 9 is a perspective view of a semiconductor relay in accordance with a second embodiment of the present invention, showing the inside of an encapsulating resin (package)

As shown in FIG. 9, the input conductor plates 5 include a first terminal plate 5a formed of an elongated rectangular plate and a second terminal plate 5b formed of an elongated rectangular plate. The first terminal plate 5a is formed into a substantially L-like shape when seen in the left-and-right direction. The first and second terminal plates 5a and 5b are arranged to protrude upward from the lower end surface 10a of the package 10 with the longitudinal direction thereof extending in the up-down direction. The lower end portions of the first and second terminal plates 5a and 5b are exposed to the outside of the package 10 through passage holes (not shown) formed in the front and rear regions of the left surface of the package 10. The exposed end surfaces of the first and second terminal plates 5a and 5b are flush with the left surface of the package 10.

Figure 10:
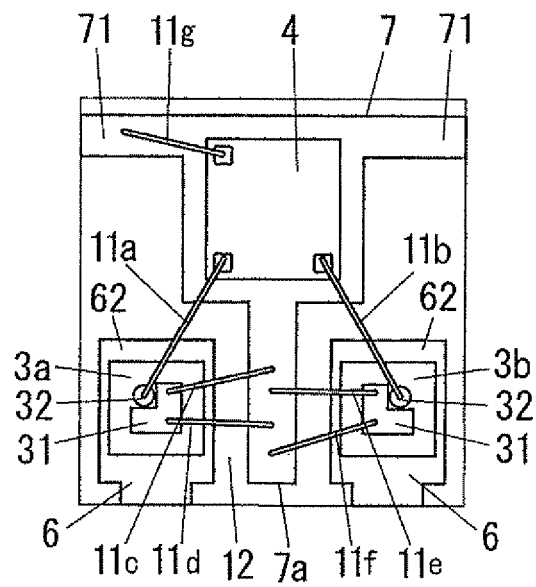
FIG. 10 is a section view of the semiconductor relay in accordance with the second embodiment.
Figure 11:
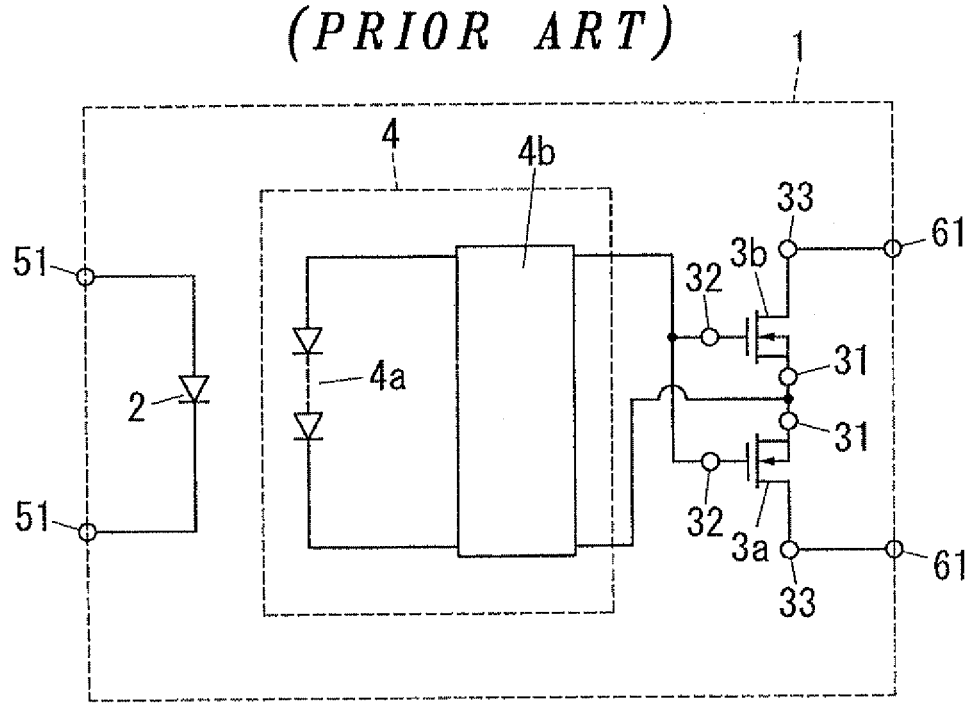
FIG. 11 is a circuit block diagram of the conventional semiconductor relay.

As shown in FIGS. 9 and 10, the central conductor plate 7 is made of an electrically conductive material and is formed into a substantially flat plate shape. The central conductor plate 7 includes a substantially bar-shaped projecting portion 7a protruding downward from the lower edge thereof and rectangular arm portions 71 extending outward from the upper front and rear ends thereof. The central conductor plate 7 is arranged to protrude upward from the lower end surface 10a of the package 10 while the tip end of the projecting portion 7a is in contact with the lower end surface 10a or the tip ends of the arm portions 71 are in contact with the front and rear end surfaces of the package 10, or both of the tip end of the projecting portion 7a and the tip ends of the arm portions 71 are contact with the lower end surface 10a and the front and rear end surfaces of the package 10, respectively. One of the arm portions 71 is connected to an electrode of the light-receiving drive element 4 through a bonding wire.

As shown in FIGS. 9 and 10, each of the output conductor plates 6 is formed by bending the lower portion of a band-like plate made of an electrically conductive material. The output conductor plates 6 are arranged to protrude upward from the right front and rear regions of the lower end surface 10a of the package 10. The lower end portions of the output conductor plates 6 are exposed to the outside of the package 10 through passage holes (not shown) formed in the front and rear regions of the right surface of the package 10. The exposed end surfaces of the output conductor plates 6 are flush with the right surface of the package 10.

With such configuration, the projecting portion 7a is arranged in the gap 12 between the output conductor plates 6 when seen in the left-and-right direction. The gate electrodes 32 of the MOSFETs 3a and 3b are connected to the light-receiving drive element 4 through bonding wires 11a and 11b. The source electrodes 31 of the MOSFETs 3a and 3b are connected to the projecting portion 7a through bonding wires 11c through 11f, whereby the source electrodes 31 are electrically connected to each other. One of the arm portions 71 is connected to the light-receiving drive element 4 through a bonding wire 11g, whereby the source electrodes 31 are electrically connected to the light-receiving drive element 4 in common.

In other words, the mount surfaces of the output conductor plates 6 and the central conductor plate 7 are oppositely disposed to the mount surfaces of the input conductor plates 5. As described in the first embodiment, the mount surfaces of the output conductor plates 6, the central conductor plate 7 and the input conductor plates 5 are perpendicular to the lower end surface 10a of the package 10.

While the invention has been shown and described with respect to the embodiments, it will be understood by those skilled in the art that various changes and modification may be made without departing from the scope of the invention as defined in the following claims.

What is claimed is:
1. A semiconductor relay, comprising:
two MOSFETs serially connected to each other, the MOSFETs having parasitic diodes reversely arranged with respect to each other;
a light emitting element having a pair of terminals, the light emitting element being configured to emit light as a specified electric power is applied between the terminals;
a light-receiving drive element configured to switch on and off the two MOSFETs depending on the presence and absence of the light emitted by the light emitting element;
two output conductor plates made of an electrically conductive material, each of the output conductor plates being electrically connected to one end of each of serial circuits of the two MOSFETs;
two input conductor plates made of an electrically conductive material, each of the input conductor plates being electrically connected to the respective terminals of the light emitting element; and
an encapsulating resin configured to encapsulate the two MOSFETs, the light emitting element, the light-receiving drive element, the two output conductor plates and the two input conductor plates,
wherein the two output conductor plates and the two input conductor plates includes terminal portions protruding outside the encapsulating resin, the terminal portions being mounted on a common printed circuit board,
wherein the two output conductor plates includes mount portions on which the two MOSFETs are respectively mounted or on which drain electrodes of the two MOSFETs are respectively connected, the mount portions are encapsulated by the encapsulating resin, and a thickness direction of the mount portions intersects a thickness direction of the printed circuit board, and wherein the two MOSFETs are located between the light-receiving drive element and the printed circuit board.

2. The semiconductor relay of claim 1, wherein the two MOSFETs are integrated into a single chip.

3. The semiconductor relay of claim 1, wherein each of the two MOSFETs is surface mounted on each of the output conductor plates.

4. The semiconductor relay of claim 1, wherein the two MOSFETs are interconnected at an interconnecting point, and the interconnecting point is directly electrically connected to the light-receiving drive element by a wire bonding.

5. The semiconductor relay of claim 1, further comprising:
a flat-shaped central conductor plate made of an electrically conductive material to which the light-receiving drive element is fixed,
wherein the central conductor plate is encapsulated by the encapsulating resin and a thickness direction of the central conductor plate intersects the thickness direction of the printed circuit board, and
wherein the two MOSFETs are interconnected at an interconnecting point, and the interconnecting point and the light-receiving drive element are electrically connected to the central conductor plate by wire bonding.

6. The semiconductor relay of claim 1, further comprising an additional mount portion on which the light-receiving drive element is mounted,
wherein the additional mount portion is encapsulated by the encapsulating resin and a thickness direction of the additional mount portion intersects the thickness direction of the printed circuit board, and
wherein a distance between the additional mount portion and the printed circuit board is larger than a distance between any one of the mount portions and the printed circuit board.

* * * * *